United States Patent [19]
Imura

[11] Patent Number: 5,401,991
[45] Date of Patent: Mar. 28, 1995

[54] OPTICALLY ERASEABLE NONVOLATILE SEMICONDUCTOR MEMORY

[75] Inventor: Yukihiro Imura, Tokyo, Japan

[73] Assignee: Seiko Instruments Inc., Japan

[21] Appl. No.: 361,255

[22] Filed: Jun. 5, 1989

[30] Foreign Application Priority Data

Jun. 8, 1988 [JP] Japan .................. 63-141164

[51] Int. Cl.⁶ .................. H01L 29/68; H01L 29/78
[52] U.S. Cl. .................. 257/315; 257/314; 257/402
[58] Field of Search .................. 357/59 G, 59 E, 30 I, 357/59 C, 59 D, 23.5, 23.12, 41; 257/315, 314, 402

[56] References Cited

U.S. PATENT DOCUMENTS

| | | | |
|---|---|---|---|
| 3,760,384 | 9/1973 | Krolikowski et al. | 340/173 |
| 4,412,129 | 10/1983 | Duncan | 250/239 |
| 4,472,871 | 9/1984 | Green et al. | 29/571 |
| 4,513,303 | 4/1985 | Abbas et al. | 357/23.3 |

OTHER PUBLICATIONS

Grove, *Physics & Technology of Semiconductor Devices*, pp. 68–71, 1967.

Muller et al, *Device Electronics for IC's*, pp. 399–405, 1986.
*Semiconductor Devices–Physics and Technology*, S. M. Sze, 1985, pp. 400–401, 483–484.
*Device Electronics for Integrated Circuits*, R. Muller & T. Kamins, 1986 pp. 74, 85, 90–93, 452–453.
*Semiconductors*, H. Wolf, 1971, p. 365.

*Primary Examiner*—Andrew J. James
*Assistant Examiner*—Stephen D. Meier
*Attorney, Agent, or Firm*—Bruce L. Adams; Van C. Wilks

[57] ABSTRACT

A nonvolatile semiconductor memory is comprised of a semiconductor substrate composed of N-type silicon, a pair of source and drain regions having opposite electroconductivity to that of the semiconductor substrate and being formed in a surface region of the semiconductor substrate in spaced relation to each other to define therebetween a channel region, a gate insulating film formed on the channel region, a floating gate electrode formed on the gate insulating film over the channel region and composed of N-type polysilicon, and an insulating layer formed to cover the floating gate electrode. The floating gate electrode is composed of the N-type polysilicon effective to reduce the thickness of adjacent gate insulating film below 500 Å to thereby significantly micronize the dimension of memory.

10 Claims, 2 Drawing Sheets

OPTICALLY ERASEABLE NONVOLATILE SEMICONDUCTOR MEMORY

BACKGROUND OF THE INVENTION

The present invention relates to a nonvolatile semiconductor memory having a floating gate electrode, and being operable to electrically write data and to erase the once written data by means of ultraviolet ray radiation.

Such a type of conventional memory includes an electrically programmable read only memory (EPROM) of p-channel type having floating gate, which is disclosed in Japanese Patent of Bentchkowsky published in 1976 (Japanese Patent Publication No. 31073/1976). This patent discloses the EPROM of floating gate type comprised of a pair of source and drain regions of the P+-type formed on a surface of N-type silicon substrate, a floating gate electrode formed thereon through a gate insulating film of 500 Å to 1000 Å, and a silicon oxide layer covering the electrode. The floating gate electrode is composed of P-type silicon.

FIG. 2 shows one example of the conventional EPROM element of floating gate type. A source region 12 and drain region 13 of the P-type are formed in a surface of N-type silicon substrate 11. A gate oxide film 16 is formed on the substrate surface over a channel defined between the source region 12 and the drain region 13 at a thickness of 500 Å to 1000 Å. A floating gate electrode 14 composed of P-type polysilicon is disposed on the channel through the gate oxide film 16. An insulating layer 15 composed of insulating material such as silicon oxide is formed over and around the floating gate electrode 14 so as to electrically insulate the same from other regions.

According to the conventional technology, the floating gate electrode is composed of P-type silicon, and the gate insulating film has the thickness of 500 Å to 1000 Å. However, the recent improvement in the semiconductor fabrication technology brings about remarkable micronization of semiconductor integrated circuits. In order to effect micronization of a MOS element by scaling, a gate insulating film is needed to have the thickness of 100 Å to 500 Å. When the thickness of the gate insulating film is reduced below 500 Å, the gate electrode cannot be composed of P-type silicon. The reason is that the gate electrode of P-type silicon is normally formed by doping or diffusing boron into polysilicon grown in a gas phase, and the boron particles would easily pass through a gate insulating film of thermally oxidized silicon of less than 500 Å due to thermal diffusion to thereby reach to and diffuse into the silicon substrate. The boron diffused into the silicon substrate causes a change of the threshold voltage of the MOS transistor. Further due to excessive diffusion of boron particles, the thermally oxidized film is degradated to exhibit low dielectric strength and low reliability.

SUMMARY OF THE INVENTION

An object of the invention is to, therefore, eliminate the above described drawback of conventional technology and to provide a new EPROM element of the floating gate type effective to reduce the thickness of the gate insulating film to thereby realize considerable micronization of the semiconductor device. For this purpose, the floating gate electrode is composed of N-type polysilicon to enable the reduction of thickness of the gate insulating film to below 500 Å. Moreover, in order to compensate for work function difference caused by forming the floating gate electrode of the N-type, the threshold voltage of the EPROM element is set less than or below $-1.1$ V when the floating gate electrode is not injected with electrons.

According to the present invention, the floating gate electrode is composed of N-type polysilicon in order to easily form the gate insulating film having a thickness less than 500 Å. Phosphorus or arsenic is diffused to turn the polysilicon to the N-conductive type. The phosphorus and arsenic are hardly diffused into the thermally oxidized film from the polysilicon layer so that the dielectric strength of the gate insulating film and the yield rate thereof are not reduced. Moreover, polysilicon material of the N-type is normally utilized in the recent semiconductor fabrication process. Therefore, the floating gate electrode composed of N-type silicon can be highly adoptable and matched to the existing process to thereby simplify the fabrication process of the EPROM.

DETAILED DESCRIPTION OF EMBODIMENTS

Figure 1:
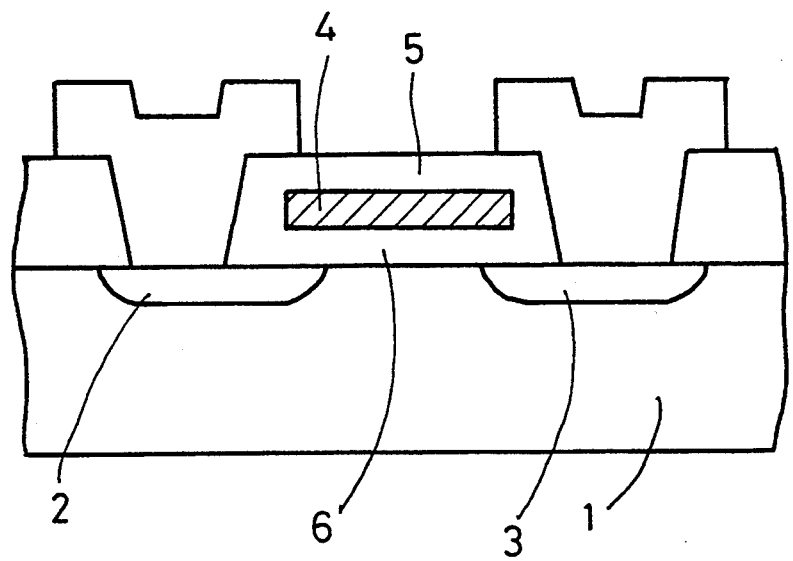
FIG. 1 is a structural sectional view showing a semiconductor nonvolatile memory according to the present invention.
Figure 2:
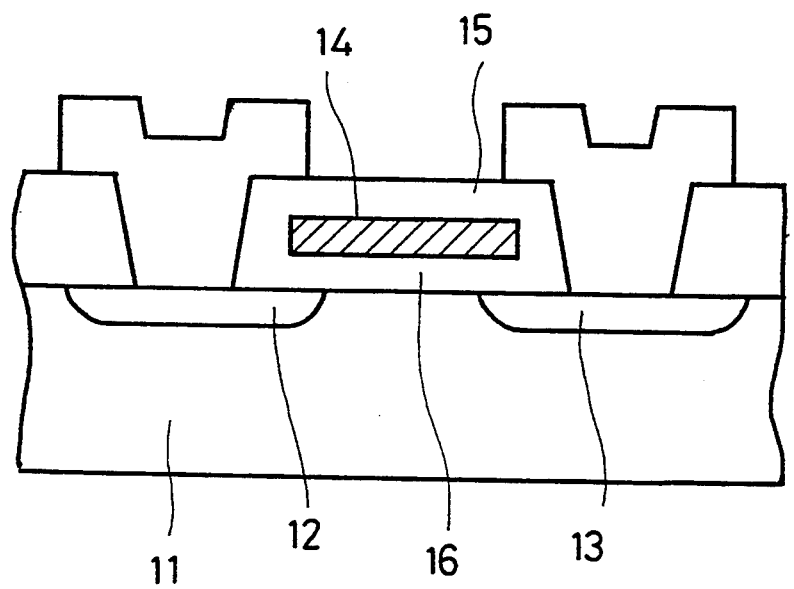
FIG. 2 is a structural sectional view of a conventional semiconductor nonvolatile memory.

FIG. 1 is a structural sectional view showing a nonvolatile semiconductor memory of the floating gate type constructed according to the present invention. A pair of P+-type regions are formed in a surface region of N-type silicon substrate 1 to define a source region 2 and a drain region 3, respectively. A gate oxide film 6 having thickness of 500 Å or less is formed on the substrate surface over a channel defined between the source region 2 and the drain region 3, and a floating gate electrode 4 composed of N-type polysilicon is formed on the gate oxide film 6 over the channel. An insulating material layer 5 is formed over and around the floating gate electrode 4 so as to electrically isolate the floating gate electrode 4 from the N-type silicon substrate 1, the source region 2 and the drain region 3. The insulating material layer 5 may be composed of siliconoxide film or siliconnitride film, or may be composed of multi-layer film of siliconoxide and siliconnitride. These insulating material layers can maintain and confine charge carriers such as electrons within the floating gate electrode for long periods of time, for example, more than 10 years.

In operation, charge carriers such as electrons are charged into the floating gate electrode 4 so as to write data. For this, a sufficiently high negative voltage is applied to the drain region 3 with respect to the source region 2 and substrate 1 to induce avalanche breakdown in the vicinity of the junction region between the drain region 3 and substrate 1 to generate, in this P-N junction depletion region, electrons of high energy such that the electrons pass through the gate insulating film 6 to inject into the floating gate electrode 4. On the other hand, in order to erase the thus written data, X-ray or ultraviolet ray radiation having energy more than 4 eV is directly irradiated onto the memory element so as to eliminate or remove electrons from the floating gate electrode 4.

Figures 3A, 3B:
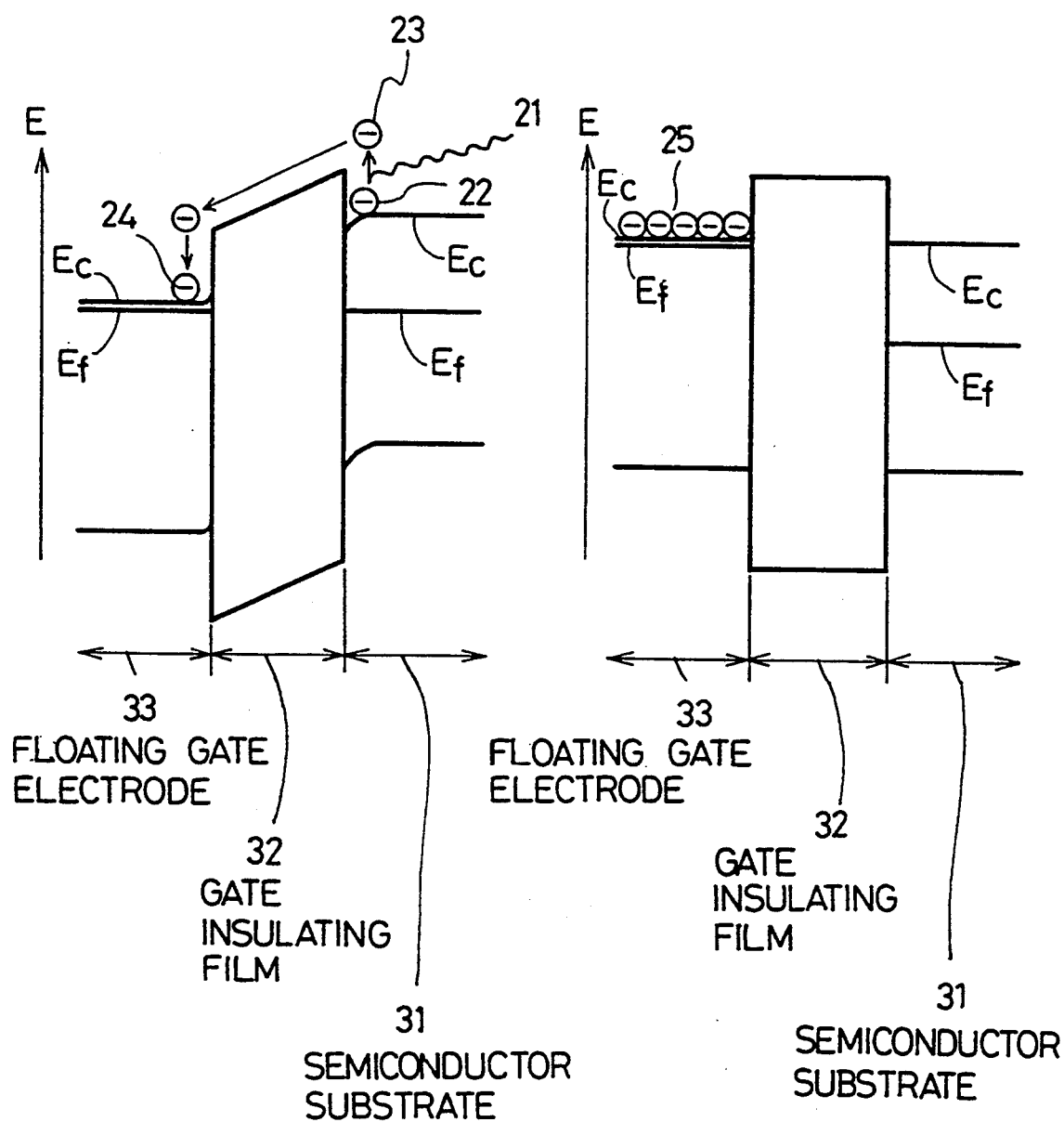
FIG. 3A is an energy band diagram of the inventive memory element before exposure to ultraviolet ray.
FIG. 3B is an energy band diagram of the same inventive memory element after exposure to ultraviolet ray.

In the memory element having the structure shown in FIG. 1, the floating gate electrode 4, gate oxide film 6 and N-type silicon substrate 1 constitute a metal-oxide-semiconductor (MOS) structure, and the threshold voltage thereof must be set below or less than −1.1 V by adjusting the doping rate of the substrate surface region. The reason will be explained hereinafter in conjunction with FIGS. 3A and 3B. FIG. 3A is a schematic diagram of the energy band structure showing the conduction band and Fermi energy levels $E_g$ and $E_f$ of the MOS structure in the memory element where the floating gate electrode is not charged with electrons and when ultraviolet ray radiation is irradiated onto the memory element. Electron 22 is excited by incident ultraviolet ray having energy $h\nu$ (h: plank constant, and $\nu$: frequency of light) in the $N^-$-type silicon substrate 31. Excited electron 23 obtains energy sufficient to transfer to the floating gate electrode 33 through the gate oxide film 32 due to the potential difference between the $N^+$-type polysilicon layer 33 and $N^-$-type silicon substrate 31 caused by the difference of impurity densities between the $N^+$-type polysilicon and $N^-$-type silicon. Lastly, electron 24 is accumulated in the floating gate electrode 33. As a result, after the irradiation of ultraviolet rays, the energy band structure is shifted as shown in FIG. 3B where the energy levels are substantially balanced at both sides, or the level of $N^-$-type silicon substrate 31 is slightly inversed relative to that of the floating gate electrode 33.

As described above, in the EPROM element having the floating gate electrode composed of $N^+$-type silicon, some electrons 25 are injected into the floating gate electrode which has not been previously charged with electrons. However, the amount of injected electrons does not exceed a critical amount determined in terms of the memory element threshold voltage of −1.1 V. The reason is that while electrons excited by the irradiation of ultraviolet rays are transferred to the floating gate electrode due to the potential difference or gradient induced in the gate oxide film, this potential difference cannot exceed the energy band gap of silicon of 1.1 V. Accordingly, by setting the threshold voltage value of the MOS structure below or less than −1.1 V in the memory element, the memory element can maintain its OFF state in which data is not written even when some electrons are injected into the floating gate electrode in response to the incidental irradiation of ultraviolet rays. On the other hand, in the normal operation, the memory element can be switched by ultraviolet rays from an ON state where the excessive amount of electrons are injected into the floating gate electrode to an OFF state where the electrons are extracted from the floating gate electrode.

The floating gate electrode is composed of N-type polysilicon so as to enable the formation of a thin gate insulating film having a thickness of less than 500 Å. The N-type polysilicon is adoptable and matched to the existing semiconductor fabrication process.

Further, the threshold voltage of the memory element is set smaller than −1.1 V so that the memory element can maintain its OFF state even when electrons are injected into the floating gate electrode in response to incidental irradiation of the ultraviolet rays, while the memory element can switch from the ON state where the floating gate electrode is injected with sufficient amount of electrons to the OFF state by dominant irradiation of light, such as ultraviolet rays, so as to erase the written data.

What is claimed is:

1. A nonvolatile semiconductor memory comprising:
   a semiconductor substrate composed of N-type silicon;
   a source region and a drain region having opposite electroconductivity to that of the semiconductor substrate and being formed in a surface region of the semiconductor substrate in spaced relation to each other to define therebetween a channel region;
   a gate insulating film having a thickness less than 500 Å formed on the channel region;
   a floating gate electrode formed on the gate insulating film over the channel region and composed of N-type polysilicon; and
   an insulating layer formed to cover the floating gate electrode;
   wherein the floating gate electrode, the gate insulating film and the semiconductor substrate constitute a metal-oxide-semiconductor structure having a threshold voltage value less than −1.1 volts to compensate the potential level shift of the floating gate electrode relative to the semiconductor substrate due to subsidiary injection of electric charge into the floating gate electrode caused by irradiation of rays onto the floating gate electrode.

2. A nonvolatile semiconductor memory according to claim 1; wherein the floating gate electrode has a capacity effective to store therein electrons to undergo writing of data, and has a sensitivity to incident ultraviolet rays effective to eliminate the stored electrons to undergo erasing of data.

3. A nonvolatile semiconductor memory according to claim 1; wherein the floating gate electrode has a capacity effective to store therein electrons to undergo writing of data, and has a sensitivity to incident x-rays effective to eliminate the stored electrons to undergo erasing of data.

4. A nonvolatile semiconductor memory comprising:
   a semiconductor substrate composed of N-type silicon and having a characteristic Fermi energy level;
   source and drain regions having opposite electroconductivity type to that of the semiconductor substrate and being formed in the surface of the semiconductor substrate in spaced relation to each other to define therebetween a channel region;
   a gate insulating film having a thickness less than 500 Å formed on the channel region;
   a floating gate electrode composed of N-type polysilicon formed on the gate insulating film over the channel region, the floating gate electrode being switchable between a charged state in which charge carriers injected from the semiconductor substrate are stored therein and an uncharged state in which charge carriers are not stored therein, and the floating gate electrode having when in the uncharged state a characteristic Fermi energy level which is shifted upwardly relative to that of the semiconductor substrate due to injection of charge carriers from the semiconductor substrate into the floating gate electrode in response to radiation irradiated on the floating gate electrode; and
   an insulating film formed over and covering the floating gate electrode;

wherein the floating gate electrode, the gate insulating film and the semiconductor substrate comprise a metal-oxide-semiconductor structure having a threshold voltage value less than −1.1 volts to compensate the Fermi energy level shift of the floating gate electrode relative to that of the semiconductor substrate caused by irradiation of radiation onto the floating gate electrode to thereby prevent unwanted switching of the floating gate electrode from the uncharged state to the charged state.

5. A nonvolatile semiconductor memory according to claim 4; wherein the semiconductor substrate contains an N-type dopant effective to set the threshold voltage of the metal-oxide-semiconductor structure at a value less than −1.1 volts.

6. A nonvolatile semiconductor memory according to claim 5; wherein the N-type dopant comprises phosphorous or arsenic.

7. A nonvolatile semiconductor memory according to claim 4; wherein the floating gate electrode has a capacity sufficient to store therein in the charged state enough charge carriers to write data in the nonvolatile semiconductor memory, and has a sensitivity to ultraviolet radiation irradiated thereon in the charged state to remove therefrom charge carriers to erase data.

8. A nonvolatile semiconductor memory according to claim 7; wherein the semiconductor substrate contains an N-type dopant effective to set the threshold voltage of the metal-oxide-semiconductor structure at a value less than −1.1 volts.

9. A nonvolatile semiconductor memory according to claim 8; wherein the N-type dopant comprises phosphorous or arsenic.

10. A nonvolatile semiconductor memory according to claim 4; wherein the floating gate electrode has a capacity sufficient to store therein in the charged state enough charge carriers to write data in the nonvolatile semiconductor memory, and has a sensitivity to x-ray radiation irradiated thereon in the charged state to remove therefrom charge carriers to erase data.

* * * * *